US010056883B2

(12) United States Patent
Lovitt

(10) Patent No.: US 10,056,883 B2
(45) Date of Patent: *Aug. 21, 2018

(54) SR LATCH CIRCUIT WITH SINGLE GATE DELAY

(71) Applicant: INPHI CORPORATION, Santa Clara, CA (US)

(72) Inventor: Travis William Lovitt, Ottawa (CA)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/451,196

(22) Filed: Mar. 6, 2017

(65) Prior Publication Data

US 2017/0179934 A1 Jun. 22, 2017

Related U.S. Application Data

(63) Continuation of application No. 14/863,864, filed on Sep. 24, 2015, now Pat. No. 9,628,055.

(51) Int. Cl.
| | |
|---|---|
| *H03H 7/30* | (2006.01) |
| *H03H 7/40* | (2006.01) |
| *H03K 5/159* | (2006.01) |
| *H03K 3/012* | (2006.01) |
| *H03K 3/356* | (2006.01) |
| *H03M 9/00* | (2006.01) |

(52) U.S. Cl.
CPC ....... *H03K 3/012* (2013.01); *H03K 3/356113* (2013.01); *H03M 9/00* (2013.01)

(58) Field of Classification Search
CPC .............................................. H04L 25/03057
See application file for complete search history.

(56) References Cited

U.S. PATENT DOCUMENTS

2013/0336075 A1* 12/2013 Song ................... G11C 8/18
  365/194
2016/0301396 A1* 10/2016 Jayapal ............ H03K 3/356008

OTHER PUBLICATIONS

Borivoje Nikolić et al., "Improved Sense-Amplifier-Based Flip-Flop: Design and Measurements", IEEE Journal of Solid-State Circuits, Jun. 2000, pp. 876-884, vol. 35, No. 6, IEEE.

* cited by examiner

*Primary Examiner* — Shuwang Liu
*Assistant Examiner* — Gina McKie
(74) *Attorney, Agent, or Firm* — Richard T. Ogawa; Ogawa P.C.

(57) ABSTRACT

An SR latch circuit with single gate delay is provided. The circuit has an enable input and an SR latch. There is first input stage having an input for receiving a set input and having an output for producing a first component of the SR latch circuit output, the first input stage having only one transistor that receives the enable input, the first input stage becoming transparent while enabled, the first input stage having a single gate delay between the input of the first input stage and the output of the first input stage. There is a second input stage having an input for receiving a reset input and having an output for producing a second component of the SR latch circuit output, the second input stage having only one transistor that receives the enable input, the second input stage becoming transparent while enabled, the second input stage having a single gate delay between the input of the second input stage and the output of the second input stage.

24 Claims, 9 Drawing Sheets

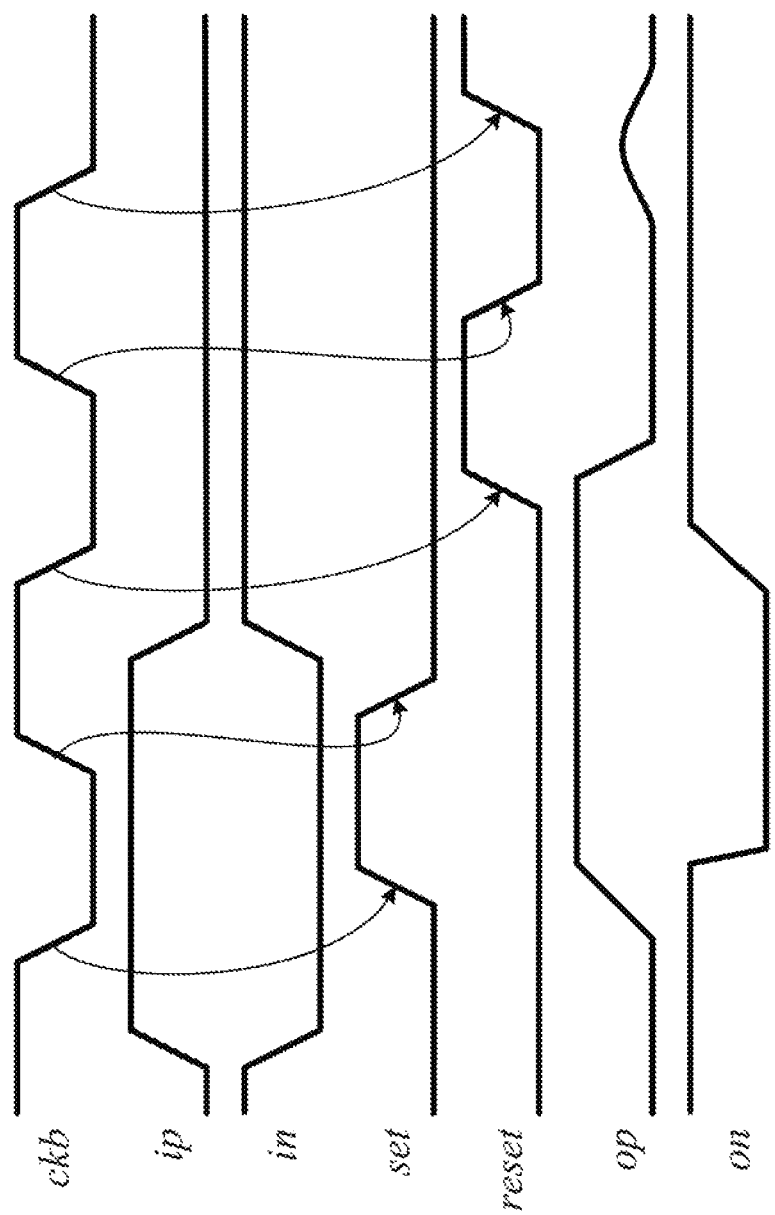

SR LATCH CIRCUIT WITH SINGLE GATE DELAY

CROSS-REFERENCE TO RELATED APPLICATIONS

The present application is a continuation of U.S. patent application Ser. No. 14/863,864, filed Sep. 24, 2015, the entire contents of which is incorporated herein by reference.

FIELD

The application relates to SR latch circuits.

BACKGROUND

An SR latch circuit (Set/Reset) is an asynchronous device: it works independently of control signals and relies only on the state of the S and R inputs. When a high is applied to the Set line of an SR latch, the Q output goes high. The SR latch circuit has a feedback mechanism that causes the Q output to remain high, even when the S input goes low again. This is how the latch circuit serves as a memory device. Conversely, a high input on the Reset line will drive the Q output low, effectively resetting the latch's "memory". When both inputs are low, the latch circuit "latches"—it remains in its previously set or reset state.

BRIEF DESCRIPTION OF THE DRAWINGS

Embodiments of the invention will now be described with reference to the attached drawings in which:

FIG. 8B is a timing diagram associated with FIG. 8A;

DETAILED DESCRIPTION

Conventional SR latches can add significant delay in a high-speed data path as they are typically composed of multiple stages (with multiple gate delays). Conventional SR latches typically have at least a two gate delay between input and output. This can be problematic for use in circuits requiring high speed, for example in a decision feedback equalizer used in high speed applications. In particular, for an SR latch circuit added in a feedback path, speed can be critical to overall system performance.

According to one aspect of the present invention, there is provided an SR latch circuit having an enable input and an SR latch circuit output comprising: a first input stage having an input for receiving a set input and having an output for producing a first component of the SR latch circuit output, the first input stage having only one transistor that receives the enable input, the first input stage becoming transparent while enabled, the first input stage having a single gate delay between the input of the first input stage and the output of the first input stage; second input stage having an input for receiving a reset input and having an output for producing a second component of the SR latch circuit output, the second input stage having only one transistor that receives the enable input, the second input stage becoming transparent while enabled, the second input stage having a single gate delay between the input of the second input stage and the output of the second input stage.

According to another aspect of the present invention, there is provided a method comprising: controlling a first input stage and a second input stage to be transparent with an enable input; receiving a set input at the first input stage and receiving a reset input at the second input stage, the set and reset input each being a RZ (return to zero) signal that is timed to become valid after the enable input has caused the input stages to become transparent; the first input stage generating a first component of a complementary SR (set reset) latch circuit output with a single gate delay between the set input and the first component of the complementary SR latch circuit output; the second input stage generating a second component of a complementary SR (set reset) latch circuit output with a single gate delay between the set input and the second component of the complementary SR latch circuit output.

Figure 1:
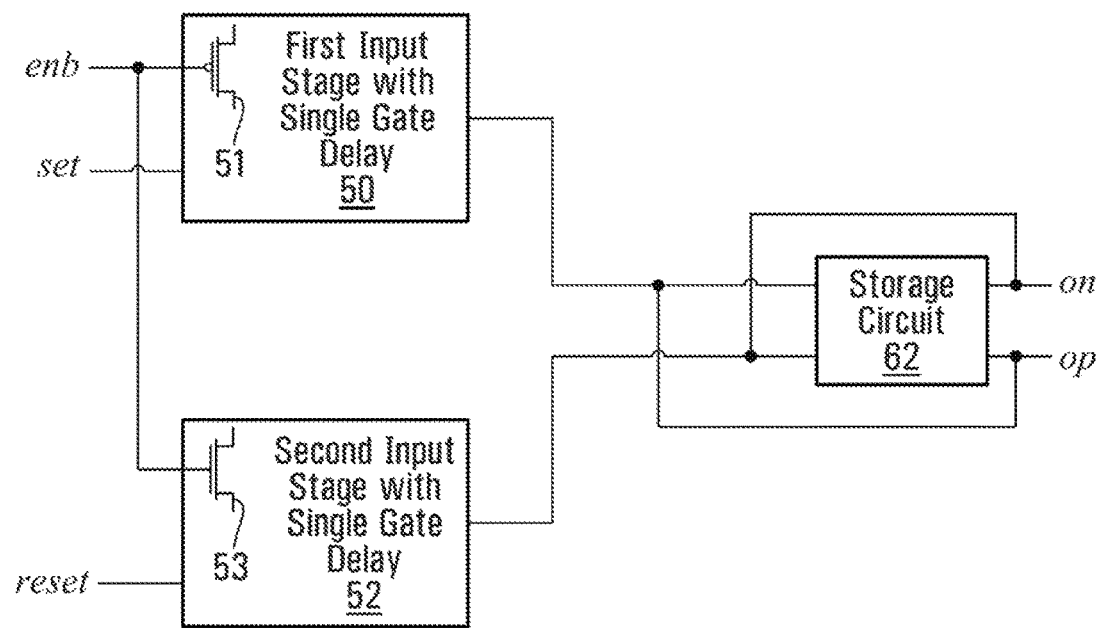
FIG. 1 is a simplified block diagram of an SR latch circuit with single gate delay provided by an embodiment of the invention.

Referring to FIG. 1, shown is an SR latch circuit provided by an embodiment of the invention. The SR latch circuit has a first input stage 50 having an input for receiving a set input and having an output for producing a first component op of the SR latch circuit output. The first input stage has only one transistor 51 that receives an enable input. The first input stage becomes transparent while enabled, and has a single gate delay between the input of the first input stage and the output of the first input stage. In the illustrated example, the enable input is enb (enable bar), such that the input stage becomes transparent while enb is low. Specific examples of such an input stage are described below. Also shown is a second input stage 52 having an input for receiving a reset input and having an output for producing a second component on of the SR latch circuit output. The second input stage has only one transistor 53 that receives the enable input. The second input stage becomes transparent while enabled, and has a single gate delay between the input of the second input stage and the output of the second input stage.

The transistors 51,53 are PMOS and NMOS transistors respectively. However this is implementation specific.

The description above refers to single gate delay. Conventionally, single gate delay is defined to exist when the longest path from input data to output data is the delay time of a single transistor gate turning on. However, note that the delay of a single gate can vary. In general the larger the device the lower the delay, but the higher the power. However, there is a lower limit to the delay regardless of size that has to do with the time for a transistor channel to turn on.

In some embodiments, the latch circuit is configured to receive set and reset input signals as RZ (return to zero)

signals that are timed to become valid after the enable input has caused the input stages 50,52 to become transparent. These may, for example, be received from an input generating circuit that generates the set input and the reset input signals. The input generating circuit may, for example, be a strong-arm slicer circuit.

Also shown is a storage circuit 62 having first and second inputs cross-connected with first and second outputs, the first output also connected to the output of the first input stage 50, and the second output also connected to the output of the second input stage 52. The storage circuit functions to hold the values at the outputs of the input stages. However, for high frequency operation, the storage circuit can be omitted in which case the circuit can rely on parasitic capacitance at the output to hold the values for a long enough period.

In some embodiments, the latch circuit is configured for return-to-zero signaling for set and reset inputs, and for non-return-to-zero signaling for the SR latch circuit output. In some embodiments, the input stages have a transparent state activated by the enable, and the input stages are configured so as to overpower the storage circuit while in the transparent state.

Figure 2:
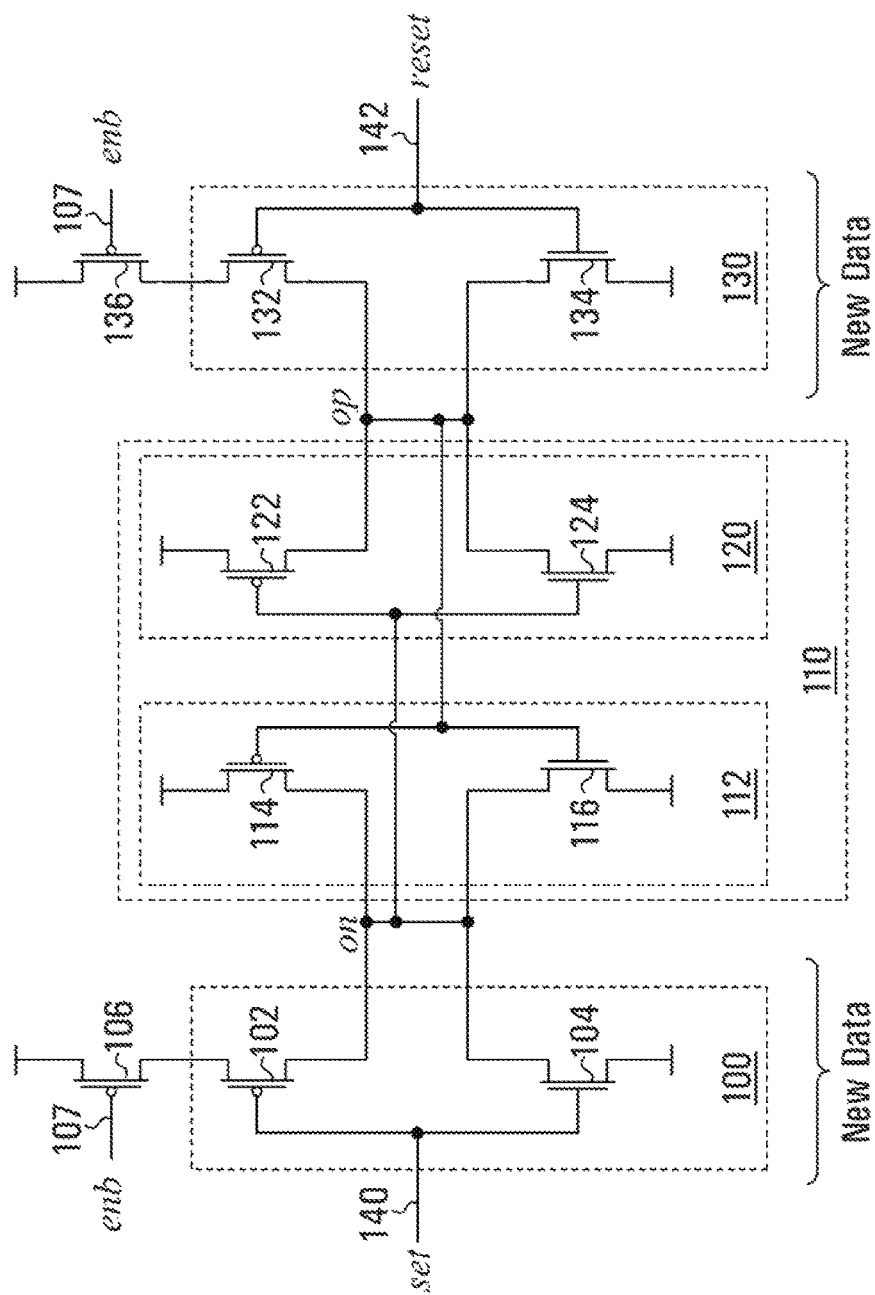
FIG. 2 is a simplified circuit diagram of an SR latch circuit with single gate delay provided by an embodiment of the invention.

Referring to FIG. 2, shown is an SR latch circuit provided by an embodiment of the invention. This is a specific example of the SR latch circuit of FIG. 1. The circuit has set and reset nodes 140,142 for receiving set and reset input signals, and an enb node 107 for receiving an enable input enb, enb being short form for enable bar, or the complement of an enable signal. The output of the circuit is taken at nodes on, and op.

The set node 140 is connected to inputs of a PMOS transistor 102 and an NMOS transistor 104 which together form an inverter circuit 100. Transistor 102 is also connected to PMOS transistor 106 which is connected to enb node 107. More specifically, set node 140 is connected to the gates of transistors 102,104. The source of transistor 104 is connected to ground. The drains of transistors 104,102 are connected together and to node on. The source of transistor 102 is connected to the drain of transistor 106. Enable input enb is received at the gate of transistor 106. The source of transistor 106 is connected to power.

The inverter circuit 100 in combination with PMOS transistor 106 constitute a specific example of the first input stage 50 with single gate delay of FIG. 1. Note that the enable input enb is received at a single transistor 106.

Similarly, the reset node 142 is connected to inputs of a PMOS transistor 132 and an NMOS transistor 134 which together form an inverter circuit 130. Transistor 132 is also connected to PMOS transistor 136. PMOS transistor 136 is connected to enb node 107.

More specifically, reset input 142 is connected to the gates of transistors 132,134. The source of transistor 134 is connected to ground. The drains of transistors 134,132 are connected together and to node op. The source of transistor 132 is connected to the drain of transistor 136. Enable input enb is received at the gate of transistor 136. The source of transistor 136 is connected to power.

The inverter 130 in combination with PMOS transistor 136 form a specific example of a second input stage 52 with single gate delay circuit of FIG. 1. Note that the enable input enb is received at a single transistor 132.

Also shown is a storage circuit 110 composed of cross-coupled inverters 112,120. Inverter 112 is composed of PMOS transistor 114 and NMOS transistor 116, and has an input connected to node op and an output connected to node on. Inverter 120 is composed of PMOS transistor 122 and NMOS transistor 124, and has an input connected to node on and an output connected to node op.

In the description of FIG. 2, the power supplies have been referred to as power and ground. More generally, any appropriate power supplies for CMOS circuitry may be employed. Other example naming conventions include positive and negative, or vdd and vss.

Storage circuit 110 is a specific example of the storage circuit 62 of FIG. 1.

With the circuit of FIG. 2, the enable is active low, and signals at nodes set and reset are active high. The set and reset signals carry complementary input data, and use RZ (return to zero) signaling. With complementary input data, (set,reset)=(1,0) for a one, and (set,reset)=(0,1) for a zero. Data is valid for half the enable cycle, and then returns to zero for the other half-cycle. The output signals at the on and op nodes are complementary NRZ (non-return-to-zero) signals, and are valid for the whole enable cycle. (op,on)=(1,0) for a one, and (op,on)=(0,1) for a zero.

An operating objective is that only one of set and reset is allowed to be high at a time and furthermore, this is only allowed when enb is low. This objective may be achieved through appropriate definition of the enb, set and reset signals in preceding circuitry. Enb is related to a clock used to generate set and reset. Making enb earlier than set and reset can increase the speed, but at the cost of higher power. This will be detailed further below in the discussion of the timing diagrams.

With the circuit of FIG. 2, when enb is low, the inverter circuits 100,130 behave like regular inverters, sensing new data. During this time, the inverter circuits 100,130 overpower the storage circuit 110. This can be achieved, for example, by using larger transistors for the inverter circuits 100,130 than for the storage circuit 110.

When enb is high, the inverter can pull low, but cannot pull high. In other words, a "one" input will be pulled low, but a "zero" input will not be pulled high. During this time, the latch circuit is holding onto previous data. However, as detailed below, only a (0,0) input is valid when enb is high.

It is noted that the inverter circuit 100 in combination with PMOS transistor 106 differs from a conventional clocked inverter. A conventional clocked inverter would include a clocked NMOS transistor connected to transistor 104. The two clocked transistors would receive a clock input clock, clockb that in effect gates the input data. This additional transistor would pull a zero high when clockb is high. However, in addition, this transistor increases the input capacitance of the circuit in that now, both the additional transistor and transistor 104 need to be charged to generate a one on output node on. With such a conventional clocked inverter circuit, there would be a one gate delay. However, if the clocked NMOS was sized the same as the input NMOS, the delay may be twice as large. Another way to look at it is to achieve the same delay as the provided circuit the input NMOS and clocked NMOS may need to be twice as large (and therefore increasing loading on previous circuit). A reduced input capacitance can help with the performance of preceding stages. In contrast, to a clocked inverter, where a clock gates the data, in some embodiments an enabled signal is used to enable the input stage in advance of the input data going valid. In this sense, the enable signal is not gating the input data.

Figure 3:
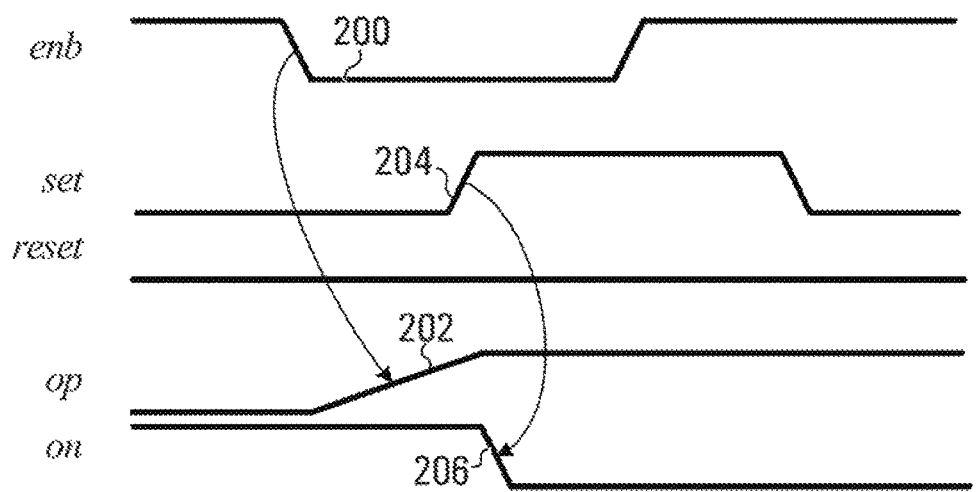
FIGS. 3 and 4 are timing diagrams associated with FIG. 2.

FIG. 3 is a timing diagram illustrating the latching of a "1", where the previous value had been a "0". Recall, a "1" input is represented by (1,0) at input nodes set, reset. The timing diagram shows plots for enb, set, reset, op and on. The starting state is enb high, RZ signals (set,reset)=(0,0), and NRZ signals (op,on)=(0,1) representing a "0" which is the previous latch circuit state.

On the reset side of the circuit, the enb goes low at 200 causes the inverter 130 to function as a normal inverter. The reset input is zero and enb low, so this pulls op high at 202 which involves charging transistor 134.

On the set side of the circuit, enb going low causes inverter circuit 100 to function as a normal inverter. When set goes high at 204, this pulls on low at 206.

Figure 4:
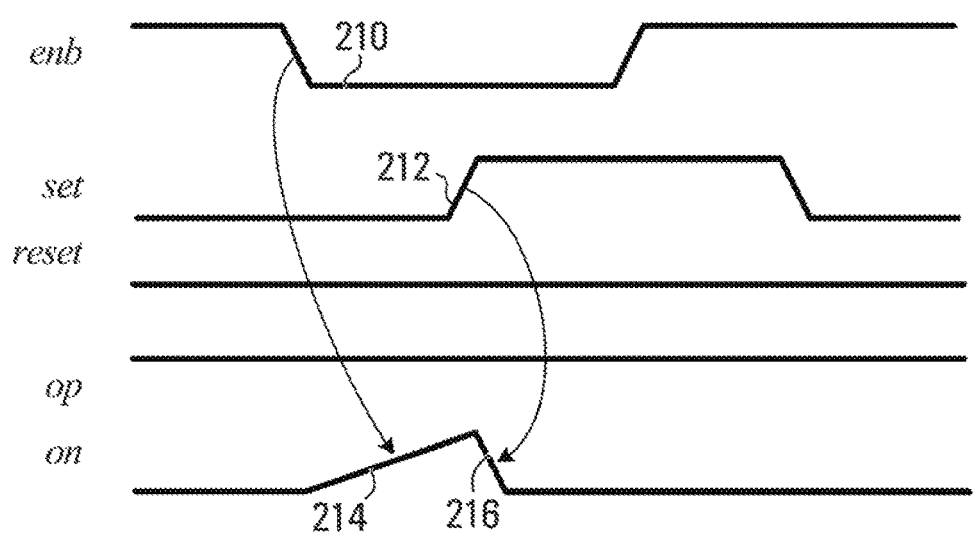

FIG. 4 is a timing diagram illustrating the latching of a "1", where the previous value had been a "1". As before, a "1" input is represented by (1,0) at input nodes set, reset. The timing diagram shows plots for enb, set, reset, on and op. The starting state is enb high, RZ signals (set,reset)=(0,0), and NRZ signals (op,on)=(1,0) representing a "1" which is the previous latch circuit state.

On the reset side of the circuit, the enb goes low at 210 causes the inverter circuit 130 to function as a normal inverter. The reset input is low and enb is low which are consistent with op being high, so there is no change at node op.

On the set side of the circuit, enb going low at 210 causes inverter circuit 100 to function as a normal inverter. While set is still low, node on starts transitioning towards an on state at 214, but when set goes high at 212, this pulls on back to low at 216.

Note that the behavior of the circuit to latch circuit a '0' is the same as described for FIGS. 3 and 4, but with the signaling for op and on reversed.

Advantageously, it can be seen with the example of FIG. 4, on begins to charge towards a one state, triggered by enb going low, irrespective of whether it is set or reset that ultimately goes high. If it is set that goes high, on is pulled back to zero. However, if it is reset that goes high, on would continue to be pulled high (as in the example of op being pulled high for set going high in the example of FIG. 3). The earlier that enb is relative to set/reset, the more that on/op is charged. This can increase speed in that on/op reach their fully charged state sooner, relative to set/reset, than they would but for the precharge triggered by enb going low. However, there is a trade off with power consumption. Extra power is consumed in order to partially charge on/op even in cases where they are not ultimately going to be pulled high.

The enb, which is based on a clock used to generate SR latch circuit input pulses (set/reset) in the previous stage is also used to pre-emptively begin the switching of the SR latch circuit output, before input data is available. Before the output fully switches, the input data then determines whether the output should fully switch or not.

It can be seen that with the provided circuit, there is a single gate delay between the set/reset input and the op/on output. For example, when set goes high, on goes low after a single gate delay introduced by inverter 100. The output of inverter 100 appears at node on immediately after processing by the inverter, notwithstanding the presence of the storage circuit 110. Similarly, when reset goes high, op goes low after a single gate delay introduced by inverter 130. The output of inverter 130 appears at node op immediately after processing by the inverter, notwithstanding the presence of the storage circuit 110.

Table 1 below is a truth table for the operation of the circuit of FIG. 2. In the truth table, "p" means the previous state, and "x" means unknown.

TABLE 1

|  | Enb | Set | Reset | on | op |
|---|---|---|---|---|---|
| Valid states | 0 | 0 | 1 | 1 | 0 |
|  | 0 | 1 | 0 | 0 | 1 |
|  | 1 | 0 | 0 | p | p |
| Invalid states | 1 | 0 | 1 | 1 | 0 |
|  | 1 | 1 | 0 | 0 | 1 |
|  | 1 | 1 | 1 | x | x |
| Bit Error | 0 | 0 | 0 | 1 | 1 |
|  | 0 | 1 | 1 | 0 | 0 |

The valid states include enb=0, in combination with one and only one of set and reset high. Another valid state is enb high with set and reset low. In this state the circuit is in a latched, non-transparent state. However, it can be seen that if either of set or reset goes high while enb is high, this is reproduced at the output. In this sense, these states are invalid.

This behavior can be contrasted with a conventional clocked SR latch circuit the truth table for which is reproduced in Table 2.

TABLE 2

| clk | Set | Reset | on | op |
|---|---|---|---|---|
| 0 | 0 | 1 | 1 | 0 |
| 0 | 1 | 0 | 0 | 1 |
| 1 | 0 | 0 | p | p |
| 1 | 0 | 1 | p | p |
| 1 | 1 | 0 | p | p |
| 1 | 1 | 1 | p | p |

The conventional clocked SR latch circuit also has bit error states when (clk, set, reset)=(0,0,0) or (0,1,1). The behavior in these states is implementation dependent.

It can be seen that the output when clk is high is valid for any set and reset inputs. However, the cost of this is increased delay, possibly a factor of two, assuming the same size NMOS transistors.

Figure 5:
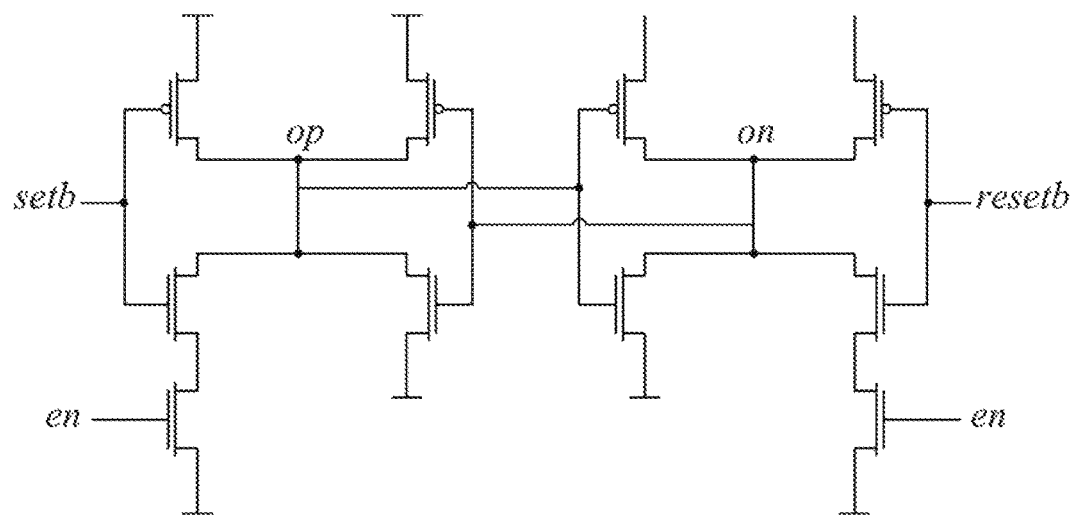
FIG. 5 is a simplified circuit diagram of another SR latch circuit with single gate delay provided by an embodiment of the invention.

FIG. 5 is a circuit diagram of another clocked SR latch circuit provided by an embodiment of the invention. This circuit is similar to that of FIG. 2, but whereas the circuit of FIG. 2 is based on an enable that is active low and set, reset active high, the circuit of FIG. 5 is based on an enable that is active high, and set, reset active low.

The valid states can be summarized as follows:

| En | Setb | Resetb | on | op |
|---|---|---|---|---|
| 1 | 0 | 1 | 0 | 1 |
| 1 | 1 | 0 | 1 | 0 |
| 0 | 1 | 1 | p | p |

The provided circuit may save data path and clock path power for the same delay, at the cost of introducing invalid states. However, these states are not a problem so long as the previous stage generates valid input signals.

The circuit of FIG. 2 includes a storage circuit 110 implemented using a pair of inverter implemented as shown. It should be understood this is a specific example. Other circuits with cross-coupled inputs and outputs can be employed.

In some embodiments, where very fast clock/data rates are employed, the storage circuit is omitted. Such a circuit would rely on the parasitic capacitance to hold the output long enough before the next clock cycle begins. Parasitic capacitance is the capacitance from existing devices in the circuit and wiring, without an explicit storage circuit.

Figure 6A:
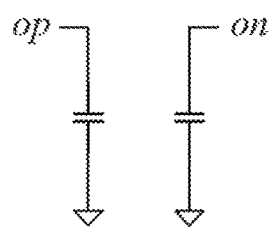
FIGS. 6A and 6B are simplified circuit diagrams for alternatives for a storage circuit.

Another storage circuit example is depicted in FIG. 6A, where capacitors at nodes op and on are used as the storage cells. As mentioned above, at very high data rates parasitic capacitance could be used.

Figure 6B:
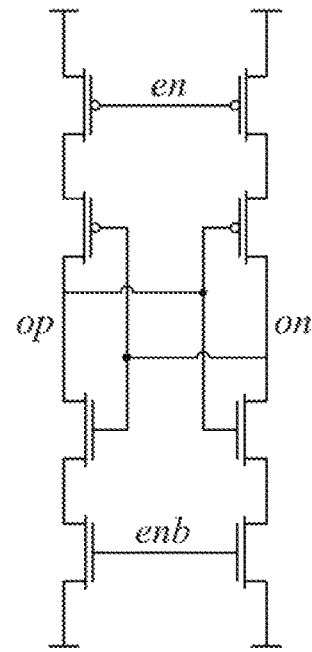

FIG. 6B is a circuit diagram of another example of a storage circuit featuring cross-coupled clocked inverters. Note that this also be done with only enable PMOS or only enabled NMOS as well. For such a storage circuit, the enable phase in this case would have to be opposite to the input stages. That is to say, when the input stages are transparent, these enabled devices are off.

It is noted that a conventional clocked SR latch circuit would generally be used to retime data to the clock. In the described embodiment, the enable is adjusted to be synchronized to the data (or vice-versa), so that there is not any retiming, thereby reducing delay.

Compared to a conventional SR latch, there are two improvements that may be realized in some instances:
1) by using a SR latch circuit with an enable that is synchronous to the data, this makes the latch circuit transparent whenever data is valid, thereby achieving a single gate delay. This may also reduce the load seen by the previous stage compared to a conventional SR latch.
2) removing a clocked device from a conventional clocked SR latch, thereby further reducing the load on the previous stage (for the same delay).
3) reducing clock path loading, thereby reducing clock path power.

Figure 7:
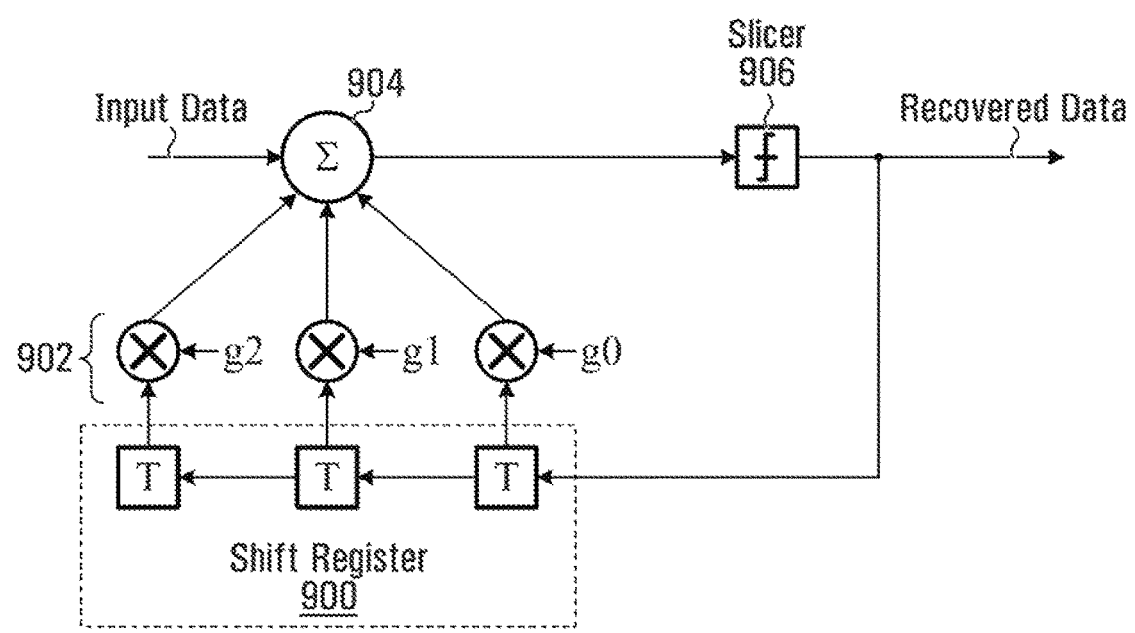
FIG. 7 is a simplified block diagram of a decision feedback equalizer.

FIG. 7 is a simplified block diagram of an example decision feedback equalizer (DFE) featuring a clocked SR latch circuit provided by an embodiment of the invention. The DFE has a shift register 900 that is made up of delay cells having "T" delay, where T is the baud period (baud period is the duration of a bit). The example depicts three delays cells, but that is implementation specific. Outputs of the delay cells are weighted in gain stage 902 with gains g0,g1,g2 and combined with the input data at 904. The combined output is passed through slicer 906 the output of which is the recovered data. This output is also fed back to the shift register.

The provided SR latch circuit can be used as a building block to implement this shift register. The provided SR latch circuit can be used in sub-rate or full-rate applications. It can be used wherever a conversion from return-to-zero to non-return-to zero signaling is needed. For example, in FIG. 7, the signals to the g0/g1/g2 gain stages must be NRZ.

Figure 8A:
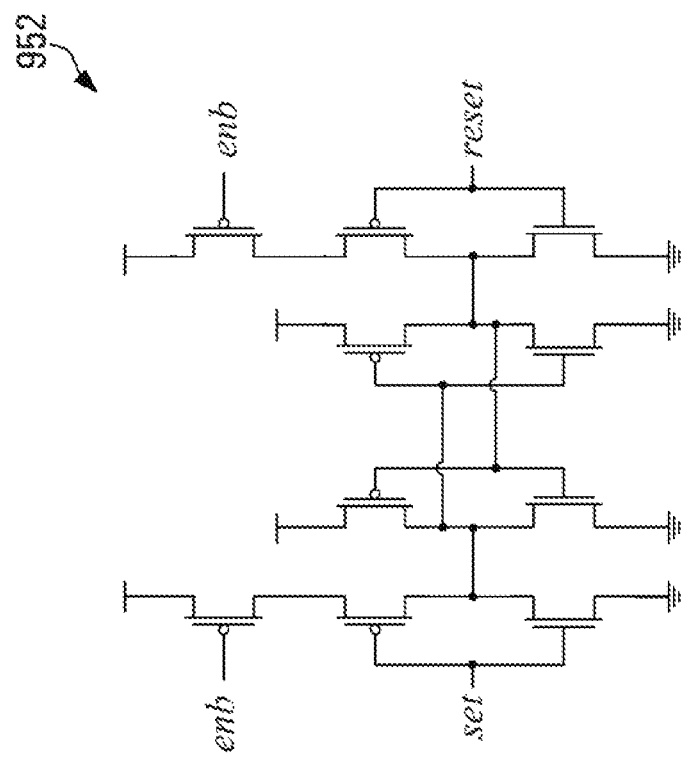
FIG. 8A is a simplified circuit diagram of a Strong-Arm slicer and an SR latch, provided by an embodiment of the invention.
Figure 8A:
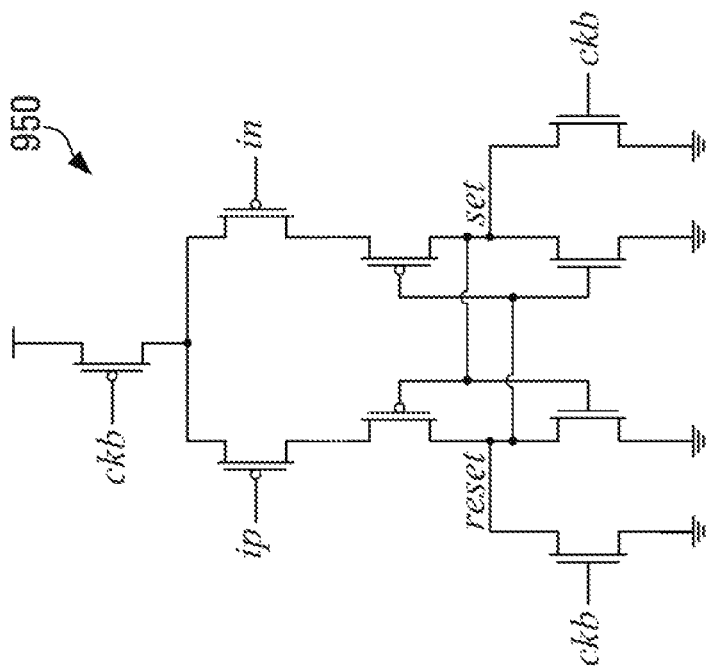

FIG. 8A depicts an example of a previous stage (a Strong-Arm slicer), generally indicated at 950, for driving the provided SR latch, an example of which is depicted at 952. A timing diagram for the combined functionality of the Strong-Arm slicer 950 and the SR latch circuit 952 is depicted at FIG. 8B. With this example:
the enb signal is active low. The Strong-Arm slicer is activated by the falling edges (see the arrows on the falling enb waveform);
the Strong-Arm slicer is edge activated: when enb falls the input data is sensed and amplified at the output; when enb rises the outputs are pre-charged (pulled to ground);
although large ip/in signals are depicted for the example, a typical Strong-Arm slicer is designed to be able to sense very small ip/in amplitudes (as small as a few mV in some cases) and output large amplitudes (reaching power supply amplitudes);
the example shows three samples taken by the strong-arm slicer, and how the SR latch circuit transitions:
1. Transition from 0 to 1 (set goes high, op/on=10)
2. Transition from 1 to 0 (reset goes high, op/on=01)
3. No transition from 0 to 0 (reset goes high, op/on does not change)

The third sample illustrates the pre-emptive nature of the SR latch, where enb causes op to begin to rise before reset pulls it back down.

Figure 9:
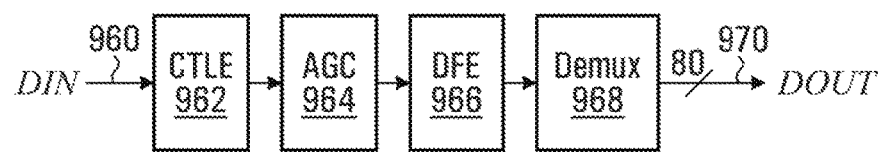
FIG. 9 is a simplified block diagram of a SerDes receiver.

Referring now to FIG. 9, shown is a simplified block diagram of a SerDes (serializer/deserializer) receiver path provided by an embodiment of the invention. A SerDes is a pair of functional blocks (transmitter and receiver) commonly used in high speed communications to compensate for limited input/output, or to convert a high speed serial signal to a slower speed parallel circuit for digital processing. These blocks convert data between serial data and parallel interfaces in each direction. The term "SerDes" generically refers to interfaces used in various technologies and applications. The primary use of a SerDes is to provide data transmission over a single/differential line in order to reduce the number of I/O pins and interconnects compared to a parallel interconnection.

The receiver path depicted in FIG. 9 includes a DIN (data input) 960, CTLE (continuous time linear equalizer) 962, AGC: (automatic gain control) 964, DFE (decision feedback amplifier) 966, Demux (demultiplexer) 962, and DOUT (data output) 970. DOUT 970 may, for example have an 80 bit bus width, but other widths are possible. The receiver path takes a received serial input and converts it to a parallel output.

The DFE of FIG. 9 is implemented using, in part, an SR latch circuit according to one of the embodiments described above.

Figure 10:
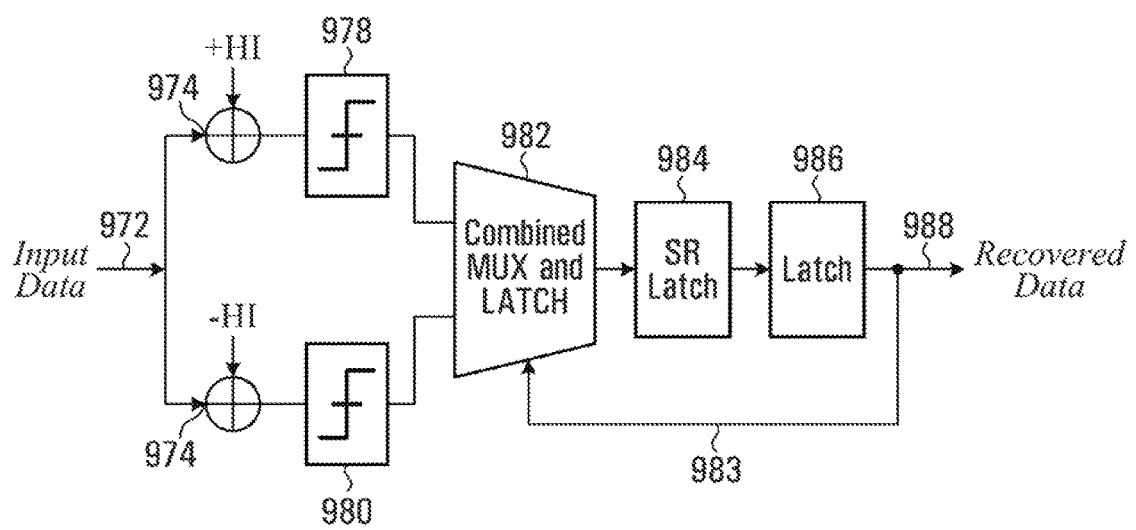
FIG. 10 is a simplified block diagram of a single tap unrolled DFE (decision feedback equalizer)

FIG. 10 is a simplified block diagram of a DFE that is used in a receiver block of a SerDes in some embodiments, and, for example, can be used as DFE 966 in the SerDes receiver of FIG. 9. This particular example is a single tap unrolled DFE.

The DFE has an input 972 connected to tap 974. The outputs of tap 974 are input to a respective slicer 978,980. The output of the two slicers 978,980 is input to a combined multiplexer and latch circuit 982 having a select input 983. The output of the combined multiplexer and latch circuit 982 is connected to an SR latch circuit 984 which in turn is connected to a latch circuit 986. The output of the latch circuit is the recovered data output 988, and this is also fed back as select input 983 to the combined multiplexer and latch circuit 982.

In operation, weights of +H1 and −H1 are added to the input using tap 974 and both potential solutions are sliced/latched with slicers 978,980. The combined multiplexer and latch circuit 982 that follows chooses either the +H1 or −H1 solution based on the previous solution (it decides the current bit's solution based on whether the previous bit was a 1 or 0).

The SR latch circuit 984 of the DFE of FIG. 6 is implemented, for example, using the SR latch circuit according to one of the embodiments described above.

It should be understood that there are a wide range of implementation options for a DFE making use of the SR latch circuit according to one of the embodiments described above, and FIG. 10 is a very specific example.

Figure 11:
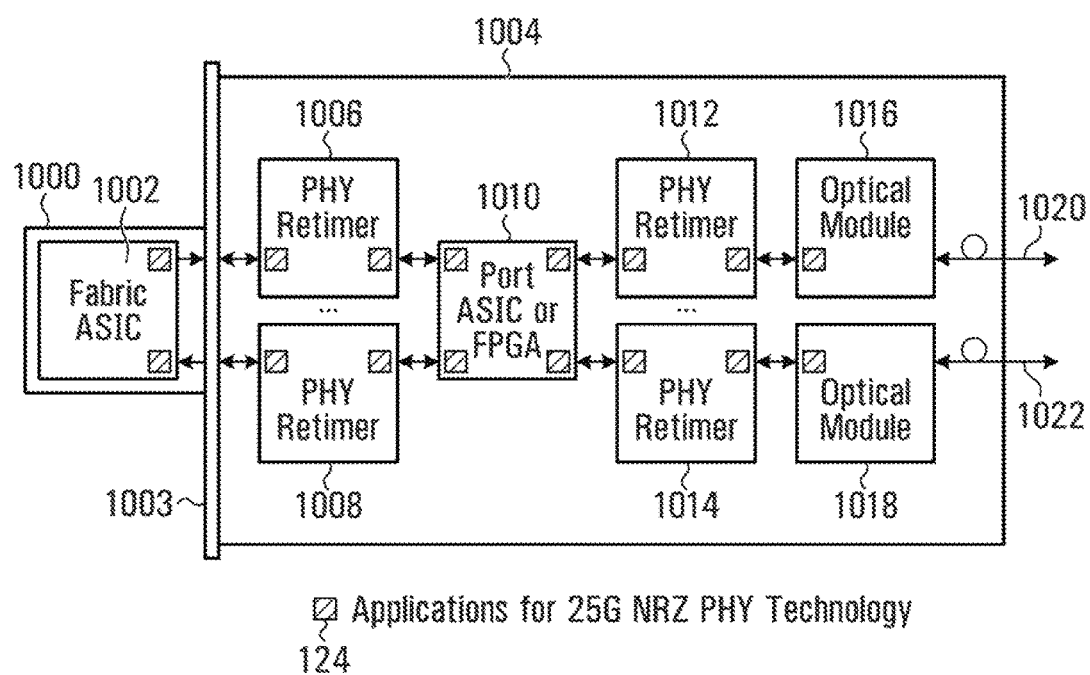
FIG. 11 is a simplified block diagram of a system employing 25 G NRZ technology.

Referring now to FIG. 11 shown is a simplified block diagram of an example system using 25G NRZ technology, that employs SerDes functionality, such as described with reference to FIG. 9, and including the use of the DFE of FIG. 10.

Shown is a first circuit board 1000 connected to a second circuit board 1004, for example through a backplane or long board trace. The first circuit board 1002 includes fabric ASIC 1000. The second circuit board 1004 includes a first PHY retimer 1006 connected to the fabric ASIC 1002, and also to port ASIC or FPGA 1010 which is then connected in sequence to PHY retimer 1012 and optical module 1016 which has an optical output 1020. Interconnections between components 1002,1006,1010,1012,1016 are all serial interconnections. PHY retimer 1008, port ASIC or FPGA, PHY retimer 1014 and optical module 1018 having optical output 1022 are interconnected in a similar manner.

In operation, the fabric ASIC 1002 may for example, receive data from several different port devices. Using information in the data, the device will route data to the appropriate destination port. The PHY retimers 1006,1008, 1012,1014 clean up data signals after transmission over the backplane or long board trace, or more generally any channel that introduces degradation. The port ASIC or FPGA reads data traversing through the device for the purpose of analyzing, capturing, or modifying the data before it is output. The optical module 1016 is an interface between optical signaling and electrical signaling. Typically, the fabric ASIC 1002, PHY retimers 1006,1008,1012,1014, port ASIC or FPGA 1010 are each a respective integrated circuit that is mounted to a circuit board. Each optical module 1016,1018 might include a number of integrated circuits, with each module as a whole plugged into circuit board 1004.

The system shows a number of blocks 124 which implement SerDes functionality, such as that of FIGS. 9 and 10, but more generally, which makes use of the combined multiplexer and latch circuit functionality described previously. While the example shows such SerDes functionality being employed in numerous different locations, more generally in one embodiment, the SerDes functionality is used for at least one serial to parallel interface.

The SerDes blocks 124 convert the serial I/Os to/from parallel signals employed by digital circuitry within, for example, the PHY retimers, port ASIC or FPGA, Fabric ASIC or optical modules.

Another embodiment of the invention provides an integrated circuit with one or more SerDes blocks that convert serial I/Os to parallel signals; digital circuitry that operates on the parallel signals. A PHY retimer, port ASIC or FPGA or fabric ASIC are specific examples of such integrated circuits. It should be understood that the SerDes blocks might be implemented as in FIG. 9, but this is not necessarily the case. More generally, whatever the implementation is, the SerDes blocks make use of the combined multiplexer and latch circuit functionality described above.

In an example, the present techniques can be used for regulating memory devices (e.g., DDR 4 SDRAM devices, DDR4 register devices, DDR4 controller devices), and other high speed data applications. Additionally, such techniques can be used for a variety of applications such as network and/or computer storage systems, computer servers, hand held computing devices, portable computing devices, computer systems, network appliances and/or switches, routers, and gateways, and the like.

Numerous modifications and variations of the present disclosure are possible in light of the above teachings. It is therefore to be understood that within the scope of the appended claims, the disclosure may be practiced otherwise than as specifically described herein.

We claim:

1. An SR latch circuit having an enable input and an SR latch circuit output, the SR latch circuit comprising:
   a first input stage having an input for receiving a set input and having an output for producing a first component of the SR latch circuit output, the first input stage configured to receive an enable input in advance of set and reset inputs becoming valid, the enable input causing the first input stage to become transparent while enabled, the first input stage having a single gate delay between the input of the first input stage and the output of the first input stage;
   a second input stage having an input for receiving a reset input and having an output for producing a second component of the SR latch circuit output, the second input stage configured to receive the enable input in advance of set and reset inputs becoming valid, the enable input causing the second input stage to become transparent while enabled, the second input stage having a single gate delay between the input of the second input stage and the output of the second input stage.

2. The latch circuit of claim 1 further comprising:
   an input generating circuit that generates the set and reset inputs as RZ (return to zero) signals that are timed to become valid after the enable input has caused the input stages to become transparent.

3. The latch circuit of claim 2 wherein the input generating circuit comprises a strong-arm slicer circuit that generates the set and reset inputs.

4. The latch circuit of claim 1 further comprising:
   a storage circuit connected to the output of the first input stage and the output of the second input stage.

5. The latch circuit of claim 1 configured for return-to-zero signaling for set and reset inputs, and for non-return-to-zero signaling for the SR latch circuit output.

6. The latch circuit of claim 1 wherein the input stages have a transparent state activated by the enable input, and the input stages are configured so as to overpower the storage circuit while in the transparent state.

7. The latch circuit of claim 2 wherein the input generating circuit generates only valid combinations of enable input and the set and reset inputs for the SR latch circuit, wherein the valid combinations comprise:
   for enable active low:

|  | Enb | Set | Reset | on | op |
|---|---|---|---|---|---|
| Valid states | 0 | 0 | 1 | 1 | 0 |
|  | 0 | 1 | 0 | 0 | 1 |
|  | 1 | 0 | 0 | p | p |

OR
for enable active high:

|  | Enb | Set | Reset | on | op |
|---|---|---|---|---|---|
| Valid states | 1 | 0 | 1 | 0 | 1 |
|  | 1 | 1 | 0 | 1 | 0 |
|  | 0 | 1 | 1 | p | p |

8. The latch circuit of claim 4 wherein the storage circuit comprises cross-coupled inverters.

9. An integrated circuit comprising the latch circuit of claim 1.

10. A serializer deserializer comprising the latch circuit of claim 1.

11. A system comprising:
- a first circuit board;
- a second circuit board connected to the first circuit board;
- a plurality of serial interconnections, each serial interconnection interconnecting a respective pair of components in the system;
- for each of at least one of the serial interconnections, a respective serializer deserializer in accordance with claim 10.

12. A serializer deserializer comprising a decision feedback equalizer, the decision feedback equalizer comprising an SR latch circuit having an enable input and an SR latch circuit output, the SR latch circuit comprising:
- a first input stage having an input for receiving a set input and having an output for producing a first component of the SR latch circuit output, the first input stage configured to receive an enable input in advance of set and reset inputs becoming valid, the enable input causing the first input stage to become transparent while enabled, the first input stage having a single gate delay between the input of the first input stage and the output of the first input stage; and
- a second input stage having an input for receiving a reset input and having an output for producing a second component of the SR latch circuit output, the second input stage configured to receive the enable input in advance of set and reset inputs becoming valid, the enable input causing the second input stage to become transparent while enabled, the second input stage having a single gate delay between the input of the second input stage and the output of the second input stage.

13. A system comprising:
- a first circuit board;
- a second circuit board connected to the first circuit board;
- a plurality of serial interconnections, each serial interconnection interconnecting a respective pair of components in the system;
- for each of at least one of the serial interconnections, a respective serializer deserializer in accordance with claim 12.

14. An input circuit for an SR latch, the input stage circuit comprising:
- a first inverter circuit for receiving a reset input;
- a second inverter circuit for receiving a set input;
- an enable circuit configured to enable the inverter circuits such that while disabled, each inverter can pull a high input low, but cannot pull a low input high;
- an input generating circuit that generates the set and reset inputs as RZ (return to zero) signals that are timed to become valid after the enable input has enabled the first and second inverter circuits.

15. The input circuit of claim 14 wherein the first inverter circuit is a part of a first input stage and the second inverter circuit is a part of a second input stage, and the input generating circuit generates the set input and the reset inputs as RZ (return to zero) signals that are timed to become valid after the enable input has caused the input stages to become transparent.

16. The input circuit of claim 15 wherein the input generating circuit comprises a strong-arm slicer circuit that generates the set and reset inputs.

17. The input circuit of claim 14 further comprising:
- a storage circuit connected to the output of the first input stage and the output of the second input stage.

18. The input circuit of claim 14 configured for return-to-zero signaling for set and reset inputs, and for non-return-to-zero signaling for the SR latch circuit output.

19. The input circuit of claim 14 wherein the first inverter circuit is a part of a first input stage and the second inverter circuit is a part of a second input stage, and the input stages have a transparent state activated by the enable input, and the input stages are configured so as to overpower the storage circuit while in the transparent state.

20. The input circuit of claim 15 wherein the input generating circuit generates only valid combinations of enable input and the set and reset inputs for the SR latch circuit, wherein the valid combinations comprise:

for enable active low:

|  | Enb | Set | Reset | on | op |
|---|---|---|---|---|---|
| Valid states | 0 | 0 | 1 | 1 | 0 |
|  | 0 | 1 | 0 | 0 | 1 |
|  | 1 | 0 | 0 | p | p |

OR
for enable active high:

|  | Enb | Set | Reset | on | op |
|---|---|---|---|---|---|
| Valid states | 1 | 0 | 1 | 0 | 1 |
|  | 1 | 1 | 0 | 1 | 0 |
|  | 0 | 1 | 1 | p | p |

21. The input circuit of claim 17 wherein the storage circuit comprises cross-coupled inverters.

22. An integrated circuit comprising the input circuit of claim 14.

23. An input circuit for an SR latch circuit having an enable input and an SR latch circuit output, the input circuit comprising:
- a first input stage having an input for receiving a set input and having an output for producing a first component of the SR latch circuit output, the first input stage having only one transistor that receives the enable input, the first input stage becoming transparent while enabled, the first input stage having a single gate delay between the input of the first input stage and the output of the first input stage;
- a second input stage having an input for receiving a reset input and having an output for producing a second component of the SR latch circuit output, the second input stage having only one transistor that receives the enable input, the second input stage becoming transparent while enabled, the second input stage having a single gate delay between the input of the second input stage and the output of the second input stage.

24. An integrated circuit comprising the input circuit of claim 23.

* * * * *